(12) United States Patent
Abou-Khalil et al.

(10) Patent No.: US 7,826,185 B2
(45) Date of Patent: Nov. 2, 2010

(54) STRUCTURE AND CIRCUIT TECHNIQUE FOR UNIFORM TRIGGERING OF MULTIFINGER SEMICONDUCTOR DEVICES WITH TUNABLE TRIGGER VOLTAGE

(75) Inventors: Michel J. Abou-Khalil, Essex Junction, VT (US); Robert Gauthier, Jr., Hinesburg, VT (US); Hongmei Li, Williston, VT (US); Junjun Li, Williston, VT (US); Souvick Mitra, Burlington, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 777 days.

(21) Appl. No.: 11/692,481

(22) Filed: Mar. 28, 2007

(65) Prior Publication Data

US 2008/0237721 A1    Oct. 2, 2008

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. .................................. 361/56; 361/118
(58) Field of Classification Search .................. 361/56
See application file for complete search history.

(56) References Cited

U.S. PATENT DOCUMENTS

| | | | |
|---|---|---|---|
| 5,804,861 A | 9/1998 | Leach | |
| 6,566,715 B1 | 5/2003 | Ker et al. | |
| 6,583,972 B2 | 6/2003 | Verhaege et al. | |
| 6,670,678 B2 | 12/2003 | Kojima et al. | |
| 6,744,107 B1 | 6/2004 | Ker et al. | |
| 6,768,616 B2 | 7/2004 | Mergens et al. | |
| 6,804,095 B2 | 10/2004 | Kunz et al. | |
| 6,898,062 B2 | 5/2005 | Russ et al. | |
| 7,064,393 B2 * | 6/2006 | Mergens et al. | 257/360 |
| 7,113,377 B2 | 9/2006 | Salome et al. | |
| 7,196,887 B2 | 3/2007 | Boselli et al. | |
| 7,224,560 B2 * | 5/2007 | May et al. | 361/56 |
| 7,589,944 B2 * | 9/2009 | Mergens et al. | 361/56 |

(Continued)

OTHER PUBLICATIONS

Lee, Jian-Hsing, et al., "The Dynamic Current Distribution of a Multi-Fingered GGNMOS Under High Current Stress and HBM ESD Events" IEEE 44th IRPS, 2006, pp. 629-630.

(Continued)

*Primary Examiner*—Jared J Fureman
*Assistant Examiner*—Dharti H Patel
(74) *Attorney, Agent, or Firm*—Scully, Scott, Murphy & Presser, P.C.; Richard Kotulak, Esq.

(57) ABSTRACT

An external current injection source is provided to individual fingers of a multi-finger semiconductor device to provide the same trigger voltage across the multiple fingers. For example, the external injection current is supplied to the body of a MOSFET or the gate of a thyristor. The magnitude of the supplied current from each external current injection source is adjusted so that each finger has the same trigger voltage. The external current supply circuit may comprise diodes or an RC triggered MOSFET. The components of the external current supply circuit may be tuned to achieve a desired predetermined trigger voltage across all fingers of the multi-finger semiconductor device.

32 Claims, 11 Drawing Sheets

U.S. PATENT DOCUMENTS

| | | |
|---|---|---|
| 2004/0141266 A1 | 7/2004 | Ker et al. |
| 2004/0178453 A1 | 9/2004 | Duvvury et al. |
| 2005/0212051 A1 | 9/2005 | Jozwiak et al. |
| 2006/0091464 A1 | 5/2006 | Hiraoka |
| 2006/0158802 A1 | 7/2006 | Kawashimo et al. |
| 2007/0158750 A1 | 7/2007 | Glaser et al. |
| 2007/0253126 A1 | 11/2007 | Gauthier et al. |

OTHER PUBLICATIONS

Duvvury, Charvaka, et al., "Substrate Pump NMOS for ESD Protection Application" Proc. EOS/ESD Symp., 2000, pp. 1A.2.1-11.

Mergens, Markus P. J., et al., "Multi-Finger Turn-on Circuits and Design Techniques for Enhanced ESD Performance and Width-Scaling" Proc. EOS/ESD Symp., 2001, pp. 1-11.

* cited by examiner

STRUCTURE AND CIRCUIT TECHNIQUE FOR UNIFORM TRIGGERING OF MULTIFINGER SEMICONDUCTOR DEVICES WITH TUNABLE TRIGGER VOLTAGE

FIELD OF THE INVENTION

The present invention relates to semiconductor circuitry, and more particularly to a semiconductor circuit for uniform triggering of multifinger semiconductor devices.

BACKGROUND OF THE INVENTION

In typical CMOS circuitry, semiconductor devices with multiple fingers are utilized and distributed over a wide area of a chip for various purposes. The multifinger semiconductor devices can also be considered multiple parallel devices with a common control component, such as a gate of a transistor or a thyristor. A typical example is an electrostatic discharge (ESD) protection circuit that requires placement of multiple fingers of a MOSFET in a parallel connection that is spread over a chip. In this case, distribution of multiple fingers across the chip area is not only advantageous but necessary to provide maximum protection against a potential electrostatic discharge event that might happen anywhere on the chip. By connecting the sources and drains of the individual fingers in a parallel connection to form a large multifinger gate-grounded NMOSFET (GGNMOSFET), the ESD device can handle a higher amount of electrostatic charge than any individual finger.

In an ESD event, it is preferred that all the fingers of a multifinger ESD protection MOSFET turn on to maximize the charge handling capacity of the ESD circuit since the magnitude of voltage spike on the circuit is inversely proportional to the amount of current the multifinger ESD protection MOSFET can pass. However, the multiple fingers of the ESD protection MOSFET typically do not turn on simultaneously due to differences in circuit parameters among the multiple fingers. To make matters worse, once a finger turns on, the voltage on the drain, which is shared by all the fingers in the multifinger MOSFET, snaps back to a lower value, preventing a turn on of the remaining fingers. In this case, the amount of current the ESD protection MOSFET can pass is limited to the current that the one turned-on finger can pass.

FIG. 1 shows a semiconductor chip with an ESD protection MOSFET circuit provided with multiple fingers that are distributed over the chip area. One finger 10 of the ESD protection MOSFET is circled with references made to the drain 12, gate 14, and source 18. The substrate ring contact 19, or the guard ring is shown in FIG. 1 as well. The source of each finger 10 of the ESD protection MOSFET electrically contacts the substrate ring contact 19 to ground the ESD protection circuit.

FIG. 2A shows an electrical circuit comprising a finger 20 of an ESD protection NMOSFET along with an I/O pad 21. The gates of the fingers are tied together and connected to the ground, forming a gate-grounded NMOSFET (GGNMOSFET) configuration. The finger 20 comprises a drain 22, a gate 24, a source 28, a parasitic npn bipolar transistor, and a parasitic resistor 27. Also, a parasitic impact ionization current source 23 is shown between the body 26 and the drain 22 of the finger 20.

The parasitic npn bipolar transistor and the parasitic resistor 27 result from the physical structure of the finger 20 of the ESD protection NMOSFET. In a typical CMOS circuit, NFETs are built in the P-substrate with an n-doped source 28 and an n-doped drain 22. The source 28, the body 26, and the drain 22 of an NFET therefore form a parasitic npn bipolar transistor, with the source 28 being the emitter, the body 26 being the base, and the drain 22 being the collector. Since the semiconductor material forming the source 28 and the body 26 has a finite resistance, there is a parasitic resistance between the source 28 and the body 26 of each finger. Also, since the source 28 is tied to a substrate ring contact 19 that is placed around the periphery of the chip area, there is a finite resistance between the source 28 and the substrate ring contact (not shown explicitly in FIG. 2A). The parasitic resistance 27 reflects the two parasitic resistances mentioned above and has a resistance value for the path from the body 26 to the substrate ring contact. The circuit in FIG. 2 therefore reflects the parasitic components of a physical finger 10 of the ESD protection NMOSFET circuit shown in FIG. 1.

The impact ionization source 23 simulates the parasitic impact ionization current in the reversed biased junction between the body 26 and the drain 22 of one finger of the NMOSFET. This occurs naturally since the drain 22 is N-doped and the body 26 is in a P-doped substrate while a more positive voltage is applied to the drain 22 relative to the body 26 and thus forming a reversed biased diode. This current can be modeled as an exponential function of the drain-to-body voltage.

Examination of FIGS. 1 and 2A shows the source of the differences in the circuit parameters among the various fingers 10 of an ESD protection NMOSFET. Even if the non-parasitic characteristics of each finger 10 of the ESD protection NMOSFET is matched, the parasitic components are different. Specifically, the resistance of the parasitic resistor 27, or the "substrate resistance," heavily depends on the location of the finger since it includes the resistance between the source 28 and the substrate ring contact 19. A finger nearer to the substrate ring contact 19 has a lower parasitic resistance than another finger that is farther away from the substrate ring contact. However, multiple fingers are generally required to handle the large amount of current during an ESD event. To turn on the multiple fingers of an ESD protection NMOSFET during an ESD event at the same time, the trigger voltage, or the voltage at the drain 22 of a finger 20 above which the finger 20 turns on, needs to be matched.

A study demonstrating a non-uniform turn-on of a multi-finger ESD protection MOSFET is shown in Lee et al., "The Dynamic Current Distribution of a Multi-fingered GGNMOS under High Current Stress and HBM ESD Events," IEEE 44th IRPS, 2006, pp. 629-630. Lee et al. observed that during the initial transient of an ESD discharge, the current distribution is non-uniform in a GGNMOSFET according to the measurements performed on a nanosecond time scale.

A first prior art solution to this problem is to add drain ballasting resistance to individual fingers of an ESD protection MOSFET. However, this approach requires a large area of semiconductor substrate for such drain ballasting resistors. Furthermore, the addition of drain ballasting resistors adds large on-resistance in the circuit, effectively reducing the current capacity of the ESD protection MOSFET and thus, requiring a large clamping voltage.

A second prior art solution disclosed in Duvvury, "Substrate Pump NMOS for ESD Protection Applications," Proc. EOS/ESD Symp, 2000, 2000, pp. 1A.2.1-11, utilizes a substrate pump to achieve a uniform triggering voltage for a multi-finger NMOS ESD circuit. A third prior art solution disclosed in Mergens et al., "Multi-finger Turn-on Circuits and Design Techniques for Enhanced ESD Performance and Width-Scaling," Proc. EOS/ESD Symp, 2001, pp. 1-11, uses a domino-type NMOS multi-finger transistor wherein the source of a finger is connected to the gate of an adjacent finger in a cascade configuration.

While the prior art solutions tend to equalize the trigger voltages across the multiple fingers, they also tend to introduce additional resistance to the circuit. Additionally, the semiconductor area used for the prior art solutions are significant. Also, the ability to tune the trigger voltage so that a circuit would turn on at a predetermined bias voltage is also desired.

While the discussions above is limited to multi-fingered GGNMOSFETs, there is also need to control the turn-on of other multi-fingered devices such as general NMOSFETs, general PMOSFETs, and thyristors, especially when the multiple fingers of such devices are spread over a large area of a chip.

FIG. 2B shows an electrical circuit comprising a finger 20B of a PMOSFET with an I/O pad 21. The finger 20B comprises a drain 22B, a gate 24B, a source 28B, a body 26B, which is also the base of a parasitic pnp bipolar transistor, and a parasitic resistor 27B. An impact ionization current source 23 is present between the body 26B and the drain 22 B in this circuit.

FIG. 2C shows an electrical circuit comprising a finger 20C of a multi-finger thyristor with an I/O pad 21. A thyristor has a pnpn semiconductor structure. In a typical thyristor, the outer p-doped region is the anode and is connected to a positive power supply, the outer n-doped region is the cathode and is connected to a negative power supply, and the inner p-doped region is the gate and is connected to a control input. The finger 20C comprises an anode 22C, a gate 26C, a cathode 28C, and a parasitic resistor 27C. Also, an impact ionization current source 23C is a built-in component of the thyristor between the gate 26C and the cathode 28C of the finger 20C since the thyristor contains a reverse biased PN junction between the anode 22C and the gate 26C. The multiple fingers of a thyristor need to turn on at the same time to fully utilize the current capacity of the thyristor. An alternate configuration wherein the gate is connected to the inner n-doped region and corresponding alteration of circuit is herein contemplated.

In FIG. 3, an exemplary prior art ESD protection NMOSFET circuit is shown, wherein five fingers (30A-30E) are connected in a parallel connection. One end of the parallel connection of five fingers which connect the drain of each finger is connected to an I/O pad 31, which is connected to a positive power supply. The other end of the parallel connection of five fingers which connect the source of each finger is connected to a substrate ring contact 39, which is connected to ground.

Each of the fingers (30A-30E) has a parasitic bipolar transistor wherein the base (36A-36E) is the body of each finger, a parasitic injection source (33A-33E), and a parasitic resistor (37A-37E). If a design layout for each finger (30A-30E) is the same, each finger (30A-30E) has substantially the same amount of parasitic injection current. However, due to the differences in the physical resistive paths between the body (36A-36E) of each finger and the substrate ring contact 39, the resistance values of the parasitic resistors (37A-37E) are different from finger to finger. This results in variations in the trigger voltage, i.e., the voltage at the drain above which each finger to turn on. As described above, non-uniform trigger voltages across the fingers can lead to a condition wherein not all of the fingers are turned on during an ESD event.

The above problem is generic across semiconductor devices of which the trigger voltage, or the turn-on voltage, is dependent on the value of a parasitic resistance of the device. Other than multi-finger ESD protection NMOSFETs, multi-finger NMOSFETs in general, multi-finger PMOSFETs in general, and multi-finger thyristors in general have a parasitic resistance dependent trigger voltages for their fingers, and as a consequence, not all of the fingers may turn on when the device needs to be turned on.

Therefore, there exists a need for a structure and circuit technique for achieving a uniform turn-on of multi-fingered semiconductor devices without adding resistive components or with a minimal addition of resistive components.

There also exists a need for a structure and circuit technique for achieving a uniform turn-on of multi-fingered semiconductor devices with a minimal additional area for the added circuit components.

Furthermore, there exists a need for a structure and circuit technique for tuning a turn-on voltage, or a trigger voltage, of multi-fingered semiconductor devices.

SUMMARY OF THE INVENTION

To address the needs described above, the present invention provides a semiconductor circuit comprising a semiconductor device with multiple fingers wherein the multiple fingers are connected in a parallel connection; and at least one external current injection source connected to a component of said multiple fingers.

In one embodiment, the semiconductor device is a metal oxide semiconductor field effect transistor (MOSFET) and the component is the body of the semiconductor device.

In another embodiment, the semiconductor device is a semiconductor thyristor and the component is the gate of the semiconductor thyristor.

The present invention enables matching of trigger voltages, i.e., the voltage above which each finger of the multi-finger semiconductor device turns on. The trigger voltage of each finger can be matched to the trigger voltage of another finger. Through the matching of the trigger voltages, at least two of the multiple fingers have substantially matched trigger voltages. Preferably, as many of the multiple fingers as possible have substantially matched trigger voltages. Most preferably, all of the multiple fingers have substantially matched trigger voltages.

Preferably, one end of the parallel connection is connected to a positive power supply and the other end of the parallel connection is connected to a negative power supply or to ground. Preferably but not necessarily, each finger has identical primary electrical characteristics, that is, excluding the parasitic components of each of the multiple fingers, the fingers are designed to have the same threshold voltage. Also, preferably but not necessarily, the physical construction of each of the multiple fingers is identical except for the location of the placement of the fingers and the physical environment in which they are placed.

Even when the primary electrical characteristics of each finger are the same according to the design when no parasitic components are considered, the parasitic components that are introduced to each of the fingers in a physical environment are not identical. Very often, the most important parasitic component that causes the differences in the electrical characteristics of each finger is a parasitic resistance. In the case of a MOSFET, such parasitic resistance is caused by a parasitic resistor between the body of each of the multiple fingers and the substrate ring contact. In the case of a thyristor, such parasitic resistance is caused by a parasitic resistor between the gate of each of the multiple fingers and the substrate ring contact.

A CMOS circuit may have a positive power supply and a negative power supply or alternatively, a positive power supply and a connection to ground. Since a connection to ground can be considered a power supply that happens to supply zero volt, for the purposes of the description of the present invention, each of a positive power supply, a negative power supply, and a connection to ground is referred to by a "power supply." According to the present invention, the external current injection source is directly connected to the power supply to which the drain or the anode is connected. In the case of a finger of an NMOSFET, as exemplified in FIG. 2A, the source 28 is connected to the ground and the external current injection source (not shown) is directly connected to the positive power supply. In the case of a finger of a PMOSFET, as exemplified in FIG. 2B, the source 28B is connected to the positive power supply and the injection source (not shown) is directly connected to ground. In the case of a thyristor, as exemplified in FIG. 2C, the cathode 28C is connected to ground and the injection source (not shown) is directly connected to the positive power supply.

The parasitic resistance in semiconductor devices, particularly the parasitic resistance between the body of a finger of a multi-finger MOSFET and the substrate ring contact or between the gate of a finger of a multi-finger thyristor and the substrate ring contact, varies from finger to finger. With a very high probability, the set of resistance values for the collection of the parasitic resistors has at least one non-equal value within the set. In other words, unless all the parasitic resistance values somehow happen to be identical across the different fingers by chance, which would be very rare statistically, some fingers would have different parasitic resistance values than some others.

In a first case according to the present invention, it is possible to attach an external current injection source to some fingers and do not attach any external current injection source to some other fingers to match the trigger voltage of the fingers. In this case, no external current injection source is attached to at least one of the multiple fingers. Preferably, at least two of the multiple fingers have substantially matched trigger voltages. Most preferably, all of the multiple fingers have substantially matched trigger voltages.

Also, in a circuit wherein the multiple trigger voltages can be matched, the circuit can incorporate a tunable component in at least one of the external current injection sources so that the amount of injection current may be modulated. By modulating the injection current, the substantially matched trigger voltage can further be tuned to enable the turn-on of the circuit at a predetermined target trigger voltage.

In a second case according to the present invention that may or may not overlap with the first case, it is possible to attach different external current source to different fingers so that different amount of external current is injected amongst fingers. In this case, at least one external current injection source injects a different amount of injection current than another external current injection source. Preferably, at least two of the multiple fingers have substantially matched trigger voltages. Most preferably, all of the multiple fingers have substantially matched trigger voltages.

Also, in a circuit wherein the multiple trigger voltages can be matched, the circuit can incorporate a tunable component in at least one of the external current injection sources so that the amount of injection current may be modulated. By modulating the injection current, the substantially matched trigger voltage can further be tuned to enable the turn-on of the circuit at a predetermined target trigger voltage According to the present invention, specific semiconductor circuits for the purpose of matching trigger voltages across the multiple fingers of a multi-finger semiconductor device are disclosed.

In one embodiment, the semiconductor circuit comprises a semiconductor device with multiple fingers wherein the multiple fingers are connected in a parallel connection; and at least one stack of diodes that is connected to a component of one of the multiple fingers, wherein the stacks of diodes comprise one diode or a series connection of at least two diodes.

In other words, a diode or a set of at least two diodes in a series connection is used as an external current injection source that is disclosed above. The diode or the set of at least two diodes is connected to the power supply to which the sources of the multiple fingers of a multi-finger MOSFET or the cathodes of the multiple fingers of a thyristor are not directly connected. For a multi-finger NMOSFET, the diode(s) is/are directly connected to the positive power supply. For a multi-finger PMOSFET, the diode(s) is/are directly connected to the negative power supply or to ground. For a thyristor, the diode(s) is/are directly connected to the positive power supply. While all the discussions above apply when the external current injection source is a diode or a set of at least two diodes in a series connection, noteworthy points are explicitly listed in the next paragraph to emphasize that all of the features in the above discussion are still enabled.

Particularly, the semiconductor device may be a metal oxide semiconductor field effect transistor (MOSFET), in which case the component is the body of the semiconductor device, or the semiconductor device may be a semiconductor thyristor, in which case the component is the gate of the semiconductor thyristor. Also, no external current injection source may be attached to at least one of the multiple fingers and/or at least one external current injection source injects a different amount of injection current than another external current injection source. Preferably, at least two of the multiple fingers have substantially matched trigger voltages. Most preferably, all of the multiple fingers have substantially matched trigger voltages. The circuit can incorporate a tunable component in at least one of the external current injection sources so that the amount of injection current may be modulated.

In another embodiment for the purpose of matching trigger voltages across the multiple fingers of a multi-finger semiconductor device, the semiconductor circuit comprises:

a semiconductor device with multiple fingers wherein the multiple fingers are connected in a parallel connection;

at least one MOSFET, wherein the drain of the at least one MOSFET is connected to a power supply and the source of the at least one MOSFET is connected to at least one of the component of one of the multiple fingers; and at least one series connection of a resistor and a capacitor between the power supply and ground, wherein a node in said series connection is connected to the gate of the at least one MOSFET.

In other words, an RC-triggered (resistor capacitor triggered) MOSFET circuit is used as an external current injection source that is disclosed above. The RC-triggered MOSFET circuit may be formed in many different embodiments, of which one is disclosed herein. According to the embodiment disclosed herein, the drain of the RC-triggered MOSFET is connected to the power supply to which the drains of the multiple fingers of a multi-finger MOSFET or the anodes of the multiple fingers of a thyristor are directly connected. For a multi-finger NMOSFET, the drain of the RC-triggered MOSFET is directly connected to the positive power supply.

For a multi-finger PMOSFET, the drain of the RC-triggered MOSFET is directly connected to the negative power supply or to ground. For a thyristor, the drain of the RC-triggered MOSFET is directly connected to the positive power supply. A resistor is located between the gate of the RC-triggered MOSFET and the power supply to which the source of the multi-finger MOSFET or the cathode of the multi-finger thyristor is connected. In one case, one end of a capacitor is directly connected to the gate of the RC-triggered MOSFET and the other end is directly connected to the power supply to which the drain of the RC-triggered MOSFET is connected. Alternatively, one end of a capacitor is directly connected to the gate of the RC-triggered MOSFET and the other end is directly connected to a diode or a stack of diodes, which is directly connected to the power supply to which the drain of the RC-triggered MOSFET is connected. While all the discussions above apply when the external current injection source is a diode or a set of at least two diodes in a series connection, noteworthy points are explicitly listed in the next paragraph to emphasize that all of the features in the above discussion are still enabled.

Particularly, the semiconductor device may be a metal oxide semiconductor field effect transistor (MOSFET), in which case the component is the body of the semiconductor device, or the semiconductor device may be a semiconductor thyristor, in which case the component is the gate of the semiconductor thyristor. Also, no external current injection source may be attached to at least one of the multiple fingers or at least one external current injection source injects a different amount of injection current than another external current injection source. Preferably, at least two of the multiple fingers have substantially matched trigger voltages. Most preferably, all of the multiple fingers have substantially matched trigger voltages. The circuit can incorporate a tunable component in at least one of the external current injection sources so that the amount of injection current may be modulated.

According to the present invention, a method of matching trigger voltages of multiple fingers of a multi-finger semiconductor device is disclosed, which comprises:

providing a semiconductor circuit with said multi-finger semiconductor device;

providing at least one external current injection source connected to a component of one of said multiple fingers;

simulating the voltage at the body of each of the multiple fingers; and adjusting the at least one external current injection source to match the trigger voltage of one of the multiple fingers with the trigger voltage of another of the multiple fingers until all of the trigger voltages match.

Furthermore, according to the present invention, a method of tuning trigger voltages of multiple fingers of a multi-finger semiconductor device is disclosed, which comprises:

providing at least one external current injection source connected to the body of one of said multiple fingers;

providing a target trigger voltage;

simulating the voltage at the body of each of said multiple fingers; and adjusting said at least one external current injection source to match the trigger voltage of each of the multiple fingers with the target trigger voltage.

In both the method of matching and the method of tuning the trigger voltages, designing external current injection source may include designing at least one stack of diodes that is connected to the component of one of said multiple fingers, wherein the stacks of diodes comprise one diode or a series connection of at least two diodes.

In both the method of matching and the method of tuning the trigger voltages, designing external current injection source may alternatively include:

providing at least one RC-triggered MOSFET, wherein the drain of said at least one MOSFET is connected to a power supply and the source of the at least one RC-triggered MOSFET is connected to at least one of the component of one of said multiple fingers; and providing at least one series connection of a resistor and a capacitor between said power supply and ground, wherein a node in said series connection is connected to the gate of the at least one RC-triggered MOSFET.

It is understood that all of structural aspects of the semiconductor circuit with the external current injection source according to the present invention may be utilized for the method of matching and the method of tuning the trigger voltages. Particularly, the semiconductor device may be a metal oxide semiconductor field effect transistor (MOSFET), in which case the component is the body of the semiconductor device, or the semiconductor device may be a semiconductor thyristor, in which case the component is the gate of the semiconductor thyristor. Also, no external current injection source may be attached to at least one of the multiple fingers or at least one external current injection source injects a different amount of injection current than another external current injection source. Preferably, at least two of the multiple fingers have substantially matched trigger voltages. Most preferably, all of the multiple fingers have substantially matched trigger voltages. The circuit can incorporate a tunable component in at least one of the external current injection sources so that the amount of injection current may be modulated.

While the present invention finds immediate and most needed application in the embodiments described above, obvious variations are within the knowledge of one of ordinary skill in the art.

DETAILED DESCRIPTION OF THE INVENTION

The present invention is herein described in detail with accompanying figures. While the present invention is described with specific examples, such as a 5 fingered gate-grounded NMOSFET (GGNMOSFET) and a 4×30 array finger configuration for a multi-fingered NMOSFET, these are only specific exemplary cases of implementation of the present invention and one of ordinary skill in the art would readily generalize the present invention to general multi-finger NMOSFETs, general multi-finger PMOSFETs, and multi-finger thyristors with any configurations for the multiple fingers.

Figure 1:
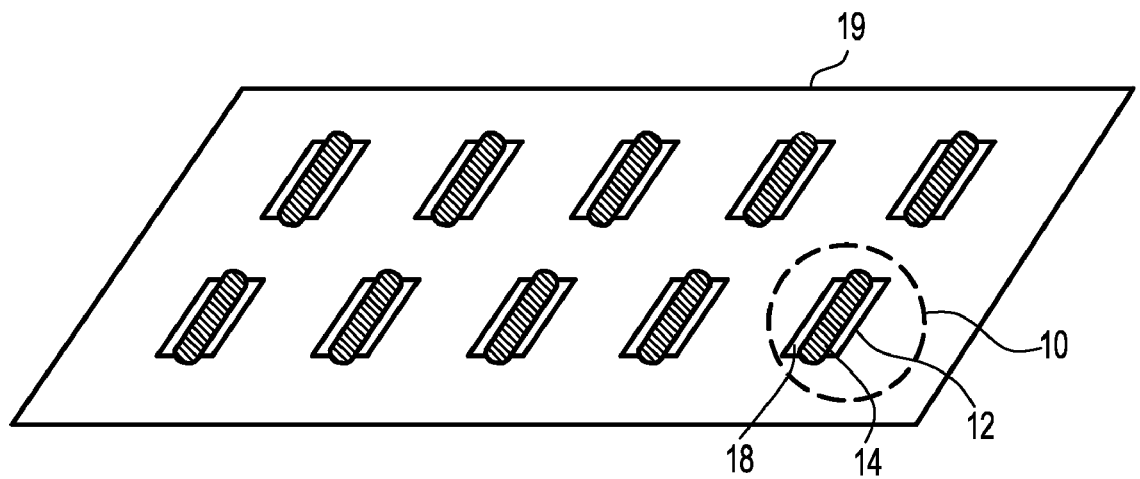
FIG. 1 shows a schematic of a chip with a multi-finger NMOSFET ESD protection circuit having multiple fingers 10 spread over a chip area.
Figure 2A:
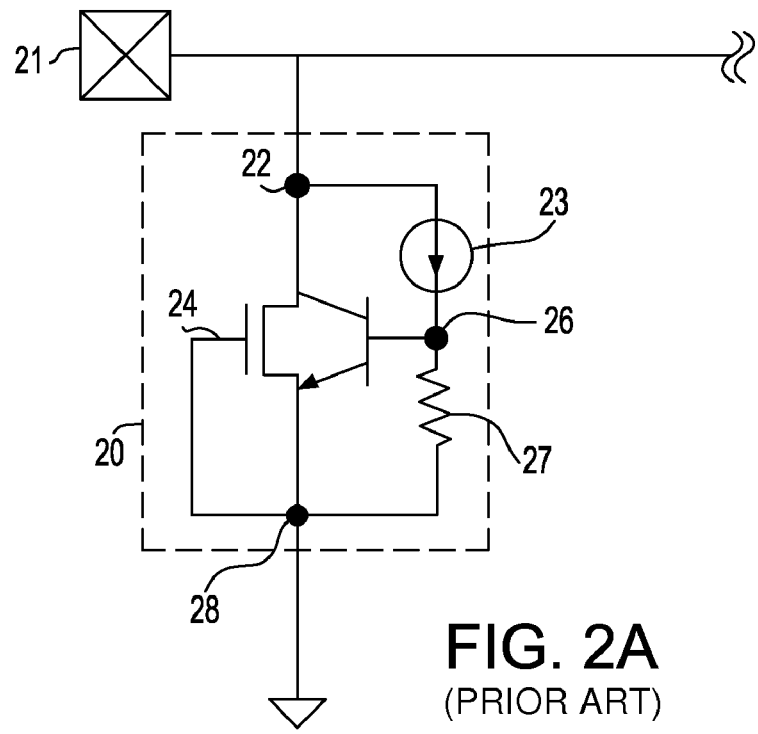
FIG. 2A shows a schematic for a finger 20 of the multi-finger NMOSFET ESD protection circuit in FIG. 1 with parasitic components.
Figure 2B:
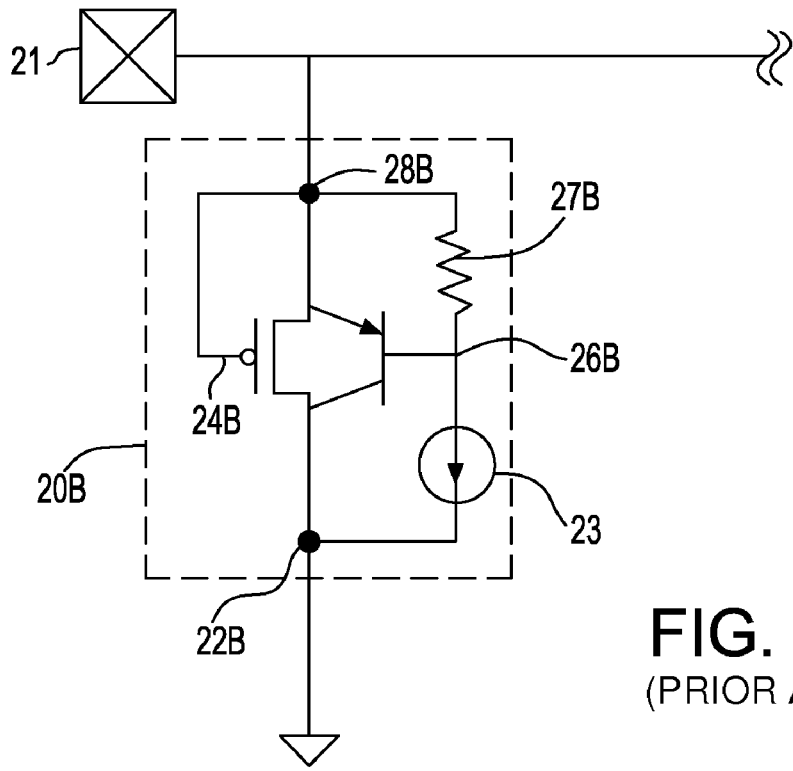
FIG. 2B shows a schematic for a finger 20B of a multi-finger PMOSFET circuit with parasitic components.
Figure 2C:
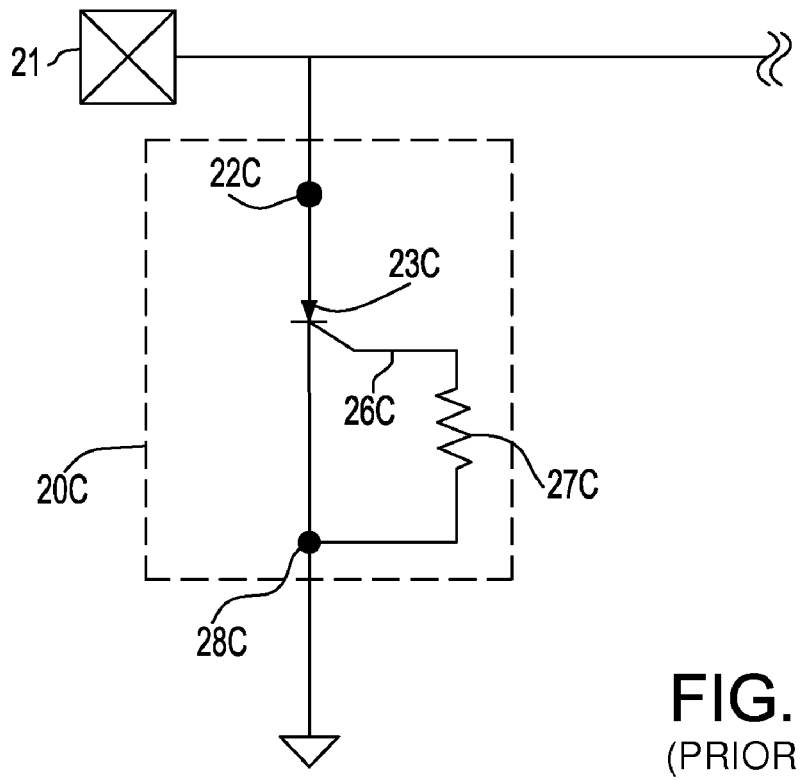
FIG. 2C shows a schematic for a finger 20C of a multi-finger thyristor circuit with parasitic components.
Figure 3:
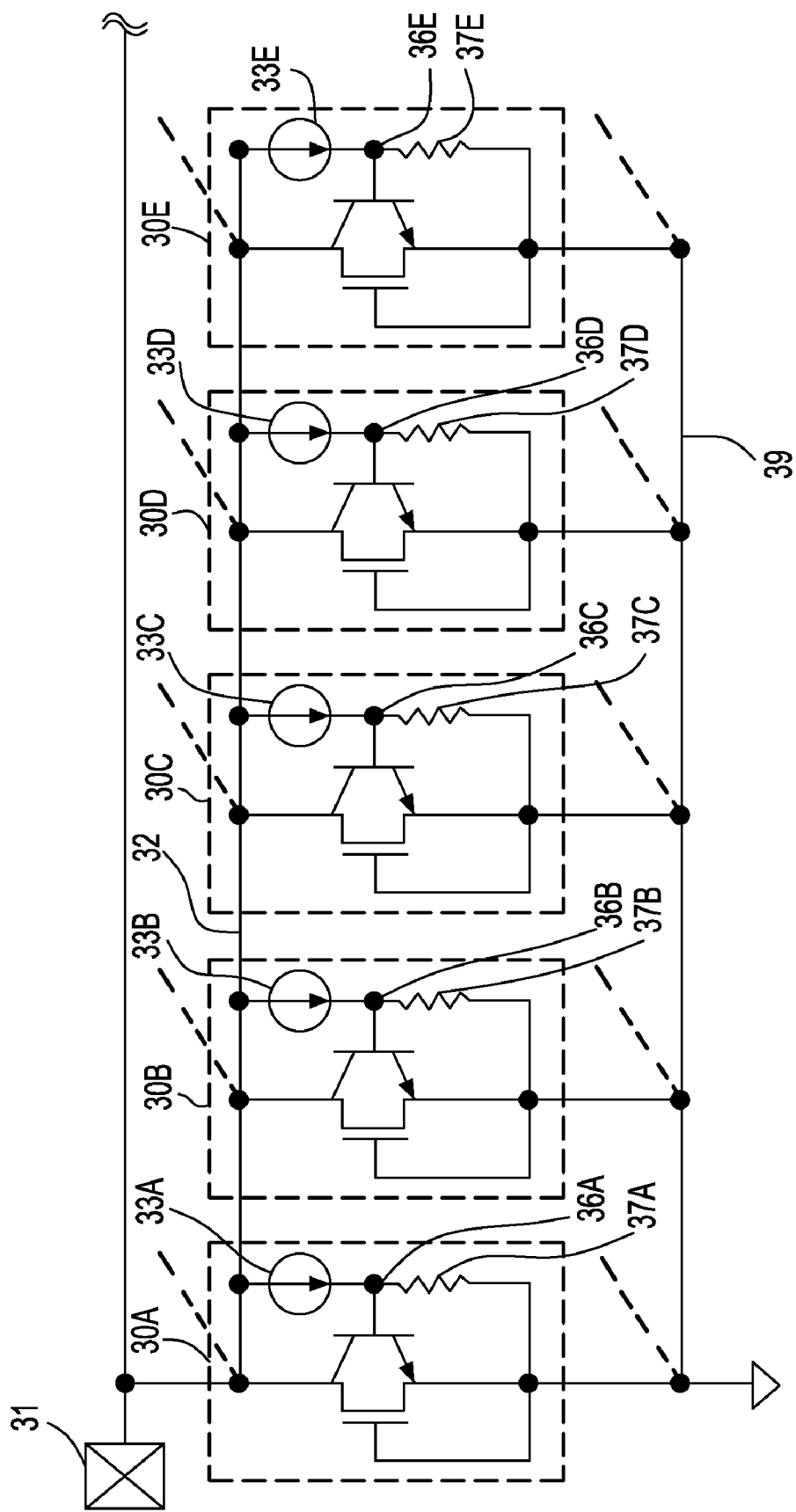
FIG. 3 shows a schematic for a prior art multi-finger NMOSFET ESD protection circuit with parasitic components.
Figure 4:
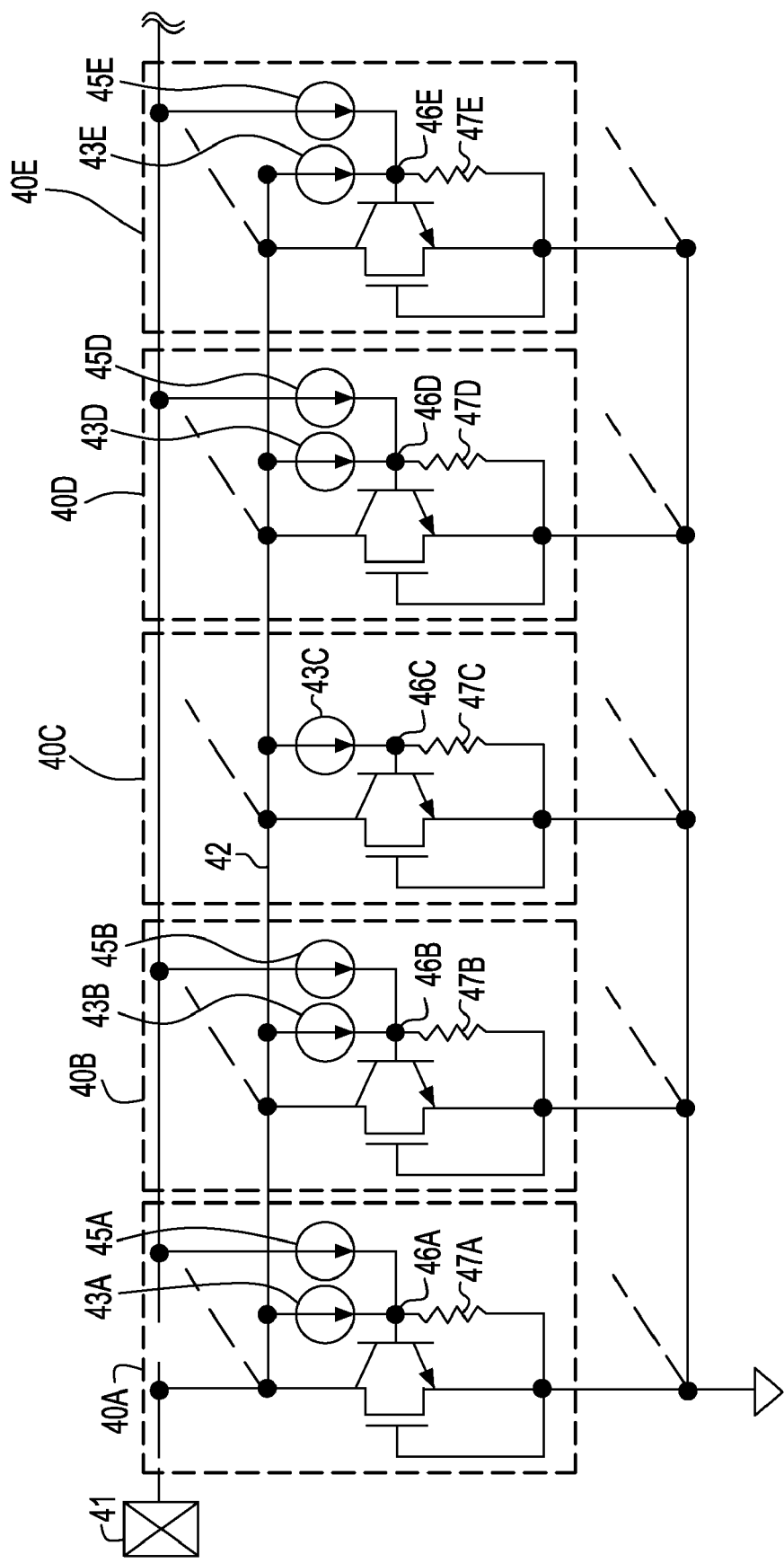
FIG. 4 shows a schematic for a multi-finger NMOSFET ESD protection circuit with external current injection sources 45A-45E, and parasitic components.

FIG. 4 shows a multi-finger NMOSFET ESD protection circuit according to the present invention. The circuit in FIG. 4 also has five fingers (40A-40E), each of which contains a parasitic bipolar transistor wherein the base (46A-46E) is the body of each finger, a parasitic injection source (43A-43E), and a parasitic resistor (47A-47E). The I/O pad 41 and the substrate ring contact 49 are identical to those in FIG. 3. If a design layout for each finger (30A-30E) is the same, each finger (40A-40E) has substantially the same amount of parasitic injection current. The differences in the placement of the fingers (40A-40E) of a multi-fingered semiconductor device cause differences in the resistance of the parasitic resistors (47A-47E) as discussed above.

According to the present invention, some fingers (40A, 40B, 40D, and 40E) have an external current injection source (45A, 45B, 45D, and 45E) between the body of a finger of the multi-finger NMOSFET and the I/O pad, which is connected to the positive power supply. The external current injection source (45A, 45B, 45D, and 45E) supplies a constant level of injection current into the body (46A, 46B, 46D, and 46E) of each finger of the multi-finger NMOSFET.

In general, the parasitic resistors are located between the body of a finger of a multi-fingered MOSFET and the substrate ring contact if the semiconductor device is a multi-fingered MOSFET. The parasitic resistors are located between the gate of a finger of a multi-fingered thyristor and the substrate ring contact if the semiconductor device is a multi-fingered thyristor. Except for limited cases involving only a very small number of fingers in a multi-fingered semiconductor device, the set of resistance values for the collection of the parasitic resistors in a multi-fingered semiconductor device has at least one non-equal value within the set due to the many variations in the placement and the environment of each of the fingers.

Particularly, in the case of multi-finger NMOSFETs for a non-ESD application, the external current injection source is connected between the body of a finger of the multi-finger NMOSFET and the positive power supply, and supplies a constant current into the base of the finger. In the case of PMOSFETs, the external current injection source is connected between the body of a finger of the multi-finger NMOSFET and the ground, and supplies a constant current out of the base of the finger into ground. In the case of thyristors, the external current injection source is connected between the gate of a finger of the multi-finger thyristor and the positive power supply, and supplies a constant current into the base of the finger. The external current injection source is connected between the body and the drain of the MOSFET or between the gate and the anode of the thyristor.

Since the drain of each finger of the multi-fingered NMOSFET is directly connected to the positive power supply, the external current injection source is directly connected to a positive power supply (Connection through an I/O pad 41 is considered a "direct connection" since the I/O pad has a negligible impedance). In the case of PMOSFETs, since the drain of each finger of the multi-fingered PMOSFET is directly connected to a negative power supply (including the case of a connection to the ground, see above), the external current injection source is also directly connected to the negative power supply. In the case of thyristors, since the external current injection source is connected to anode of a finger of the multi-fingered thyristor, the external current supply is directly connected to the positive power supply. In all the cases cited above, the external current injection source is directly connected to the power supply to which the source or the cathode of a finger is not connected to.

According to the present invention, the effects due to the variations in the resistance of the parasitic resistors (47A-47E) are compensated for to enable uniform trigger voltage for each finger (40A-40E) of the semiconductor device. The amount of compensation depends on the value of the parasitic resistance such that the voltage at the body (46A-46E) of each of the fingers in a multi-finger semiconductor device is maintained substantially the same across the multiple fingers for a given voltage at the drains (42A-42E). For example, if the parasitic resistance is high for a particular finger, the external current injection source attached to that particular finger provides less or no external current. If the parasitic resistance is low for another finger, the external current injection source attached to that particular finger provides more external current.

In the exemplary circuit of the present invention shown in FIG. 4, one finger 40C in the middle does not have an external current injection source attached to the finger. In this example, the parasitic resistor 47C that is attached to the middle finger 40C has the highest resistance. Without the additional injection current supplied by the external current injection source, the middle finger 40C has the lowest trigger voltage among the fingers (40A-40E). In this particular configuration with 5 fingers as shown in FIG. 4, the amount of the external injection current supplied to the other fingers is adjusted to match the lowest trigger voltage present in the middle finger 40C.

While the circuit in FIG. 4 shows only one finger 40C that has no external current injection source, the present invention allows generalization of the circuit in FIG. 4 such that no external current injection source is attached to at least one of the multiple fingers of a multi-finger NMOSFET in an ESD protection circuit. Furthermore, the present invention allows a further generalization such that no external current injection source is attached to at least one of the multiple fingers of a multi-finger semiconductor device such as a multi-finger NMOSFET, a multi-finger PMOSFET, and a multi-finger thyristor.

Furthermore, the present invention does not necessarily require that at least one of the fingers have no external current injection source. All the fingers of a multi-fingered semiconductor device may have an external current injection source attached to each finger or only some of them may have an external current injection source attached to them. According to the present invention, at least one external current injection source may inject a different amount of injection current than another external current injection source. By varying the amount of injection current supplied to the different fingers, the trigger voltage above which the finger turns on may be matched from finger to finger.

In another perspective, the present invention pumps current locally into the substrate, which forms the body (46A-46E) of each finger so that the trigger voltages are matched across the fingers.

According to the present invention, at least two of the multiple fingers in a multi-fingered NMOSFET ESD protection circuit have substantially matched trigger voltages above which the fingers turn on. In general, according to the present invention, at least two of the multiple fingers in a multi-fingered semiconductor device have substantially matched trigger voltages above which the fingers turn on. More preferably, according to the present invention, all of the multiple fingers in a multi-fingered semiconductor device have substantially matched trigger voltages above which the fingers turn on.

Furthermore, according to the present invention, at least one of the external current injection sources may be provided with a tunable component that modulates the amount of external current.

Figure 5:
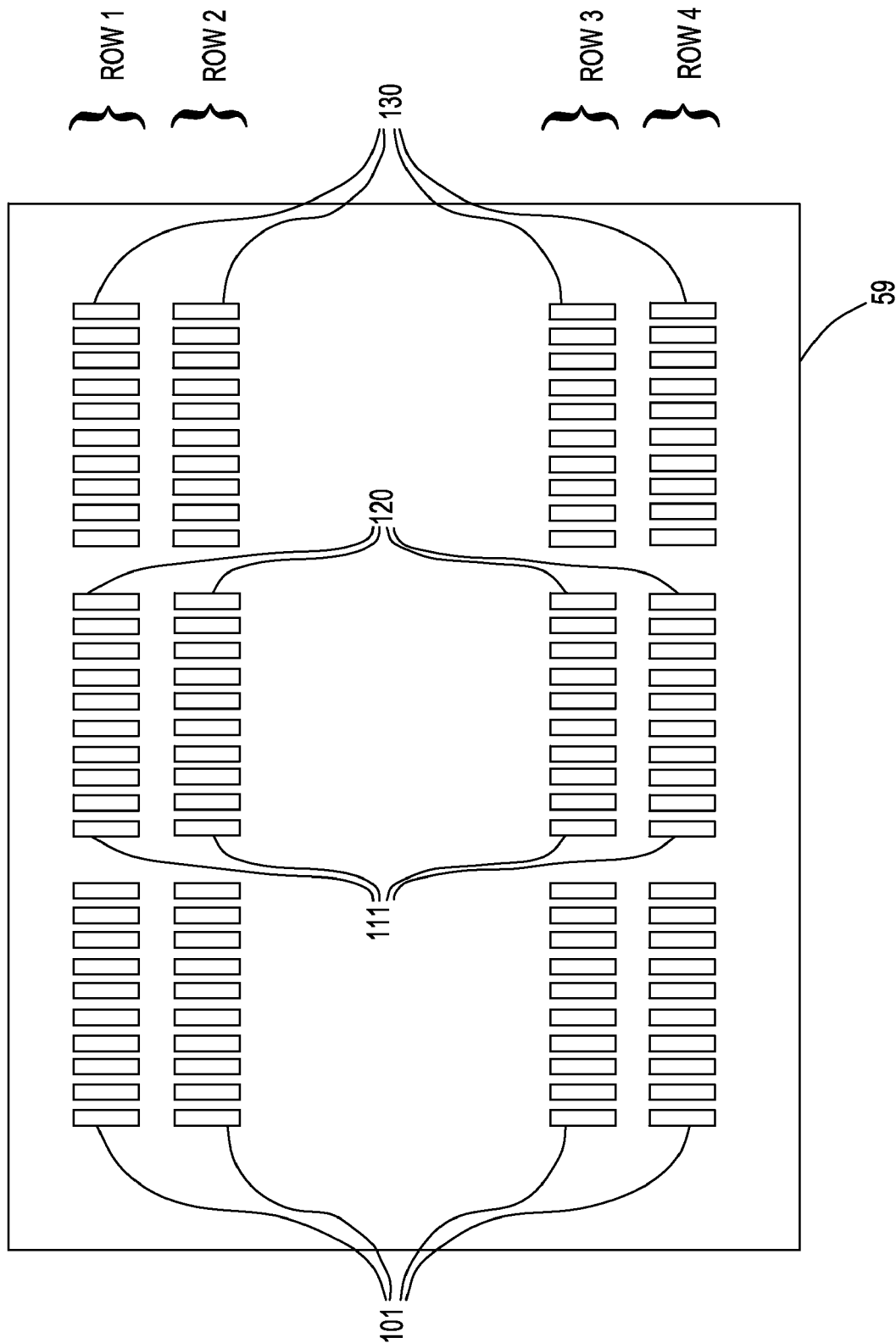
FIG. 5 shows an exemplary design with fingers of a multi-finger NMOSFET ESD protection circuit placed over a chip area in a 4×30 array.

FIG. 5 shows an exemplary layout for a 4×30 array of fingers used in a 120-finger NMOSFET ESD protection circuit. As mentioned above, it is understood that additional array configurations are practicable with the present invention. The fingers are arranged in four rows, labeled row 1, row 2, row 3, and row 4. Each row has 30 fingers with the first finger 101 at the leftmost location and the thirtieth finger 130 at the rightmost location. FIG. 5 also shows the eleventh fingers 111 and the twentieth fingers 120 for clarity. The distribution of the physical location of the fingers is for the purpose of providing enhanced ESD protection across the chip from an ESD event at an unpredictable location. In FIG. 5, the resistance between the body of each finger and the substrate ring contact is not zero due to the finite resistance of material between them.

Figure 6:
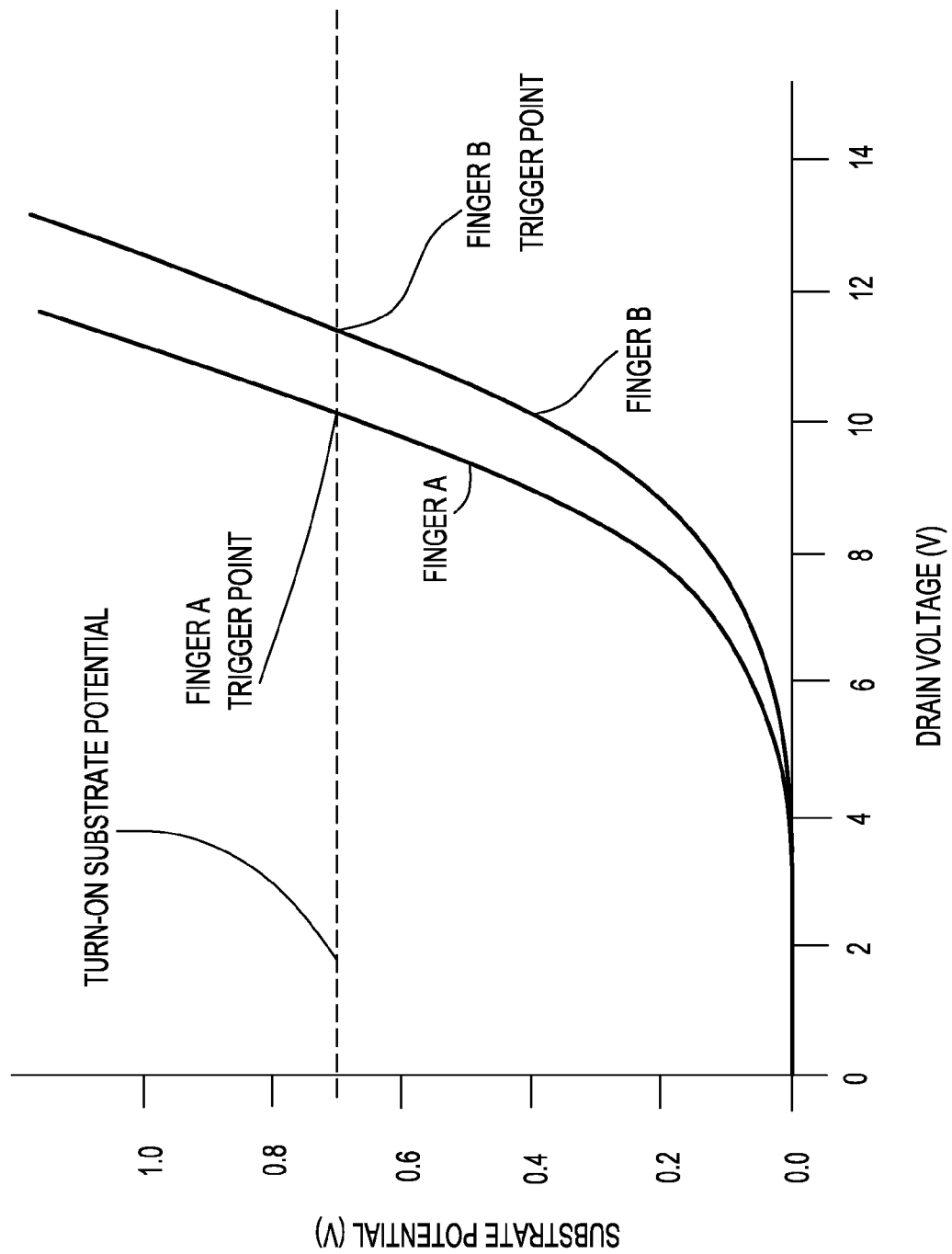
FIG. 6 shows a graph demonstrating an example of a substrate potential mismatch for a given drain voltage between two fingers, finger A and finger B, of a multi-finger NMOSFET in an ESD protection circuit.

This point is illustrated in FIG. 6, in which the curves for substrate potential versus drain voltage are plotted for two fingers, finger A and finger B, which have non-identical parasitic resistance between the body and the substrate ring contact. The two fingers belong to a hypothetical multi-finger NMOSFET in an ESD protection circuit similar to the one shown in FIG. 3. Since the parasitic bipolar transistors in FIG. 3 turns on at a "turn-on substrate potential," which is around 0.70V for a silicon based bipolar transistor, the drain voltage at which the substrate potential becomes the turn-on substrate potential is the trigger voltage for each finger. Finger A trigger voltage and Finger B trigger point are shown in FIG. 6. In general, each finger of a multi-finger device such as is shown in FIG. 3 produces a different substrate potential since the different parasitic resistances of the fingers are not compensated for. In contrast to the prior art, the differences in the parasitic resistances are compensated for by such external current injection sources (45A, 45B, 45D, and 45E) according to the present invention, as is shown in FIG. 4, which can be generalized to other multi-finger NMOSFETs, to multi-finger PMOSFETs, and to multi-finger thyristors Table 1 lists selected simulation results for the substrate potential across the multiple fingers in a prior art NMOSFET ESD protection circuit in which the fingers are arranged in a 4×30 array as shown in FIG. 5. Similarly, Table 2 lists the simulation results for the substrate potential across the multiple fingers in an NMOSFET ESD protection circuit according to the present invention in which the fingers are arranged in the same 4×30 array. The magnitude of the parasitic internal injection current through the parasitic injection sources (33A-33E in FIG. 3 or 43A-43E in FIG. 4) was set at 0.398 mA for this simulation. The comparison of the two tables show the benefit of the present invention in that the substrate potential is substantially the same for the present invention for the same drain voltage across the different fingers. The prior art circuit, in contrast, produces a substantial variation in the substrate potential at the same across the fingers.

TABLE 1

Comparison of substrate potential across the multiple fingers in a prior art 4 × 30 array of an NMOSFET ESD protection circuit at a drain voltage of 8.99 V.

|  | Row 1, 5$^{th}$ finger | Row 2, 5$^{th}$ finger | Row 1, 15$^{th}$ finger | Row 2, 15$^{th}$ finger |
|---|---|---|---|---|
| Substrate potential (V) | 0.600 | 0.690 | 0.605 | 0.700 |

TABLE 2

Comparison of substrate potential across the multiple fingers in a 4 × 30 array of an NMOSFET ESD protection circuit with external current injection source according to the present invention at a drain voltage of 8.78 V.

|  | Row 1, 5$^{th}$ finger | Row 2, 5$^{th}$ finger | Row 1, 15$^{th}$ finger | Row 2, 15$^{th}$ finger |
|---|---|---|---|---|
| Substrate potential (V) | 0.690 | 0.685 | 0.700 | 0.700 |

A comparison of the simulated trigger voltages, i.e., the drain voltage at which the substrate potential of each finger reaches the "turn-on substrate voltage" (which is 0.7V in a silicon based NMOSFET parasitic npn bipolar transistor) is shown in Table 3. Selected trigger voltages of the fingers of the prior art NMOSFET ESD protection circuit that utilizes the 4×30 array in FIG. 6 but does not have an external injection current source of an each finger are listed in one row of the table. Trigger voltages for the corresponding fingers of an NMOSFET ESD protection circuit according to the present invention that utilizes the 4×30 array in FIG. 6 and has external injection current sources of varying level of injection current to match the substrate potential are listed in another row. The comparison of the ranges of the two sets of the trigger voltages show the advantage of the present invention in that the trigger voltage distribution is much uniform according to the present invention.

TABLE 3

Comparison of trigger voltages for selected fingers in an NMOSFET ESD protection circuit according to the prior art and an NMOSFET ESD protection circuit according to the present invention.

|  | Row 1, 5$^{th}$ finger | Row 2, 5$^{th}$ finger | Row 1, 15$^{th}$ finger | Row 2, 15$^{th}$ finger |
|---|---|---|---|---|
| Trigger voltage according to the prior art (V) | 9.14 | 9.00 | 9.13 | 8.99 |

TABLE 3-continued

Comparison of trigger voltages for selected fingers in an NMOSFET ESD protection circuit according to the prior art and an NMOSFET ESD protection circuit according to the present invention.

| | Row 1, 5$^{th}$ finger | Row 2, 5$^{th}$ finger | Row 1, 15$^{th}$ finger | Row 2, 15$^{th}$ finger |
|---|---|---|---|---|
| Trigger voltage according to the present invention (V) | 8.81 | 8.81 | 8.78 | 8.78 |

Figure 7:
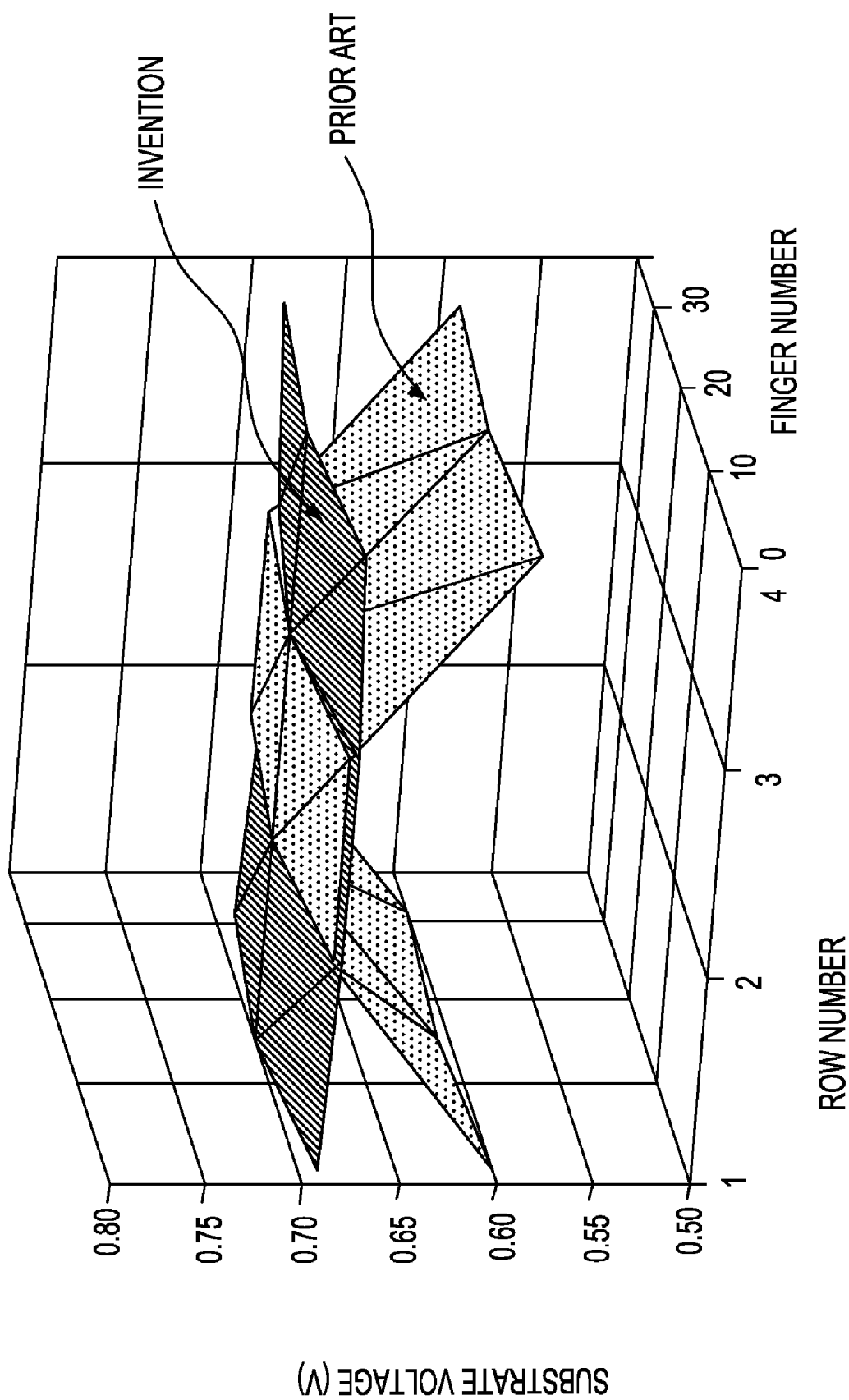
FIG. 7 shows a simulation result for substrate voltages across fingers according to a prior art circuit and for substrate voltages according to the present invention with external current injection sources for a given I/O voltage.

FIG. 7 shows the result of a simulation comparing the substrate potential, i.e., the voltage at the body for a given drain voltage, at the drain voltage of 8.9V between a prior art 120-finger NMOSFET ESD protection circuit as shown in FIG. 3 and having finger arrangements as shown in FIG. 5 and a 120-finger NMOSFET ESD protection circuit with an external current injection source between the body and the drain of each finger according to the present invention as shown in FIG. 4 and having finger arrangements as shown in FIG. 5. In the circuit according to the present invention, the magnitude of the injection current from each external current source was adjusted to substantially match substrate potential. Since the drain voltage versus substrate potential curves, such as shown in FIG. 6, have similar shape across the fingers, once the substrate potential is substantially matched for a reasonable drain voltage, the trigger voltages are also substantially matched across the fingers. Therefore, the use of the external current injection sources can reduce the variations in the trigger voltage through the matching of substrate potential near the turn-on conditions of the fingers. The matched trigger voltages enable a uniform turn-on of the multiple fingers to utilize the full current passing capacity of the multi-finger semiconductor device.

The external current injection source can be any electronic sub-circuit that is capable of providing extra current into the body of a finger of the multi-finger device. For example, an external current injection source can be a diode, a stack of diodes, a bipolar transistor, a MOSFET, or any combination of these and may contain resistive components. Preferably, the external current injection circuit contains at least one substantially non-resistive electronic component. Substantially non-resistive electronic components have a very small parasitic resistance in relation to the amount of current it passes through. Examples of substantially non-resistive components include a PN junction (such as in a diode), a capacitor, a MOSFET, and an inductor. Most preferably, the external current injection source does not contain a resistor (a resistive electronic component) in the path of the current from the power supply to the body of a finger of the multi-finger device.

Figure 8:
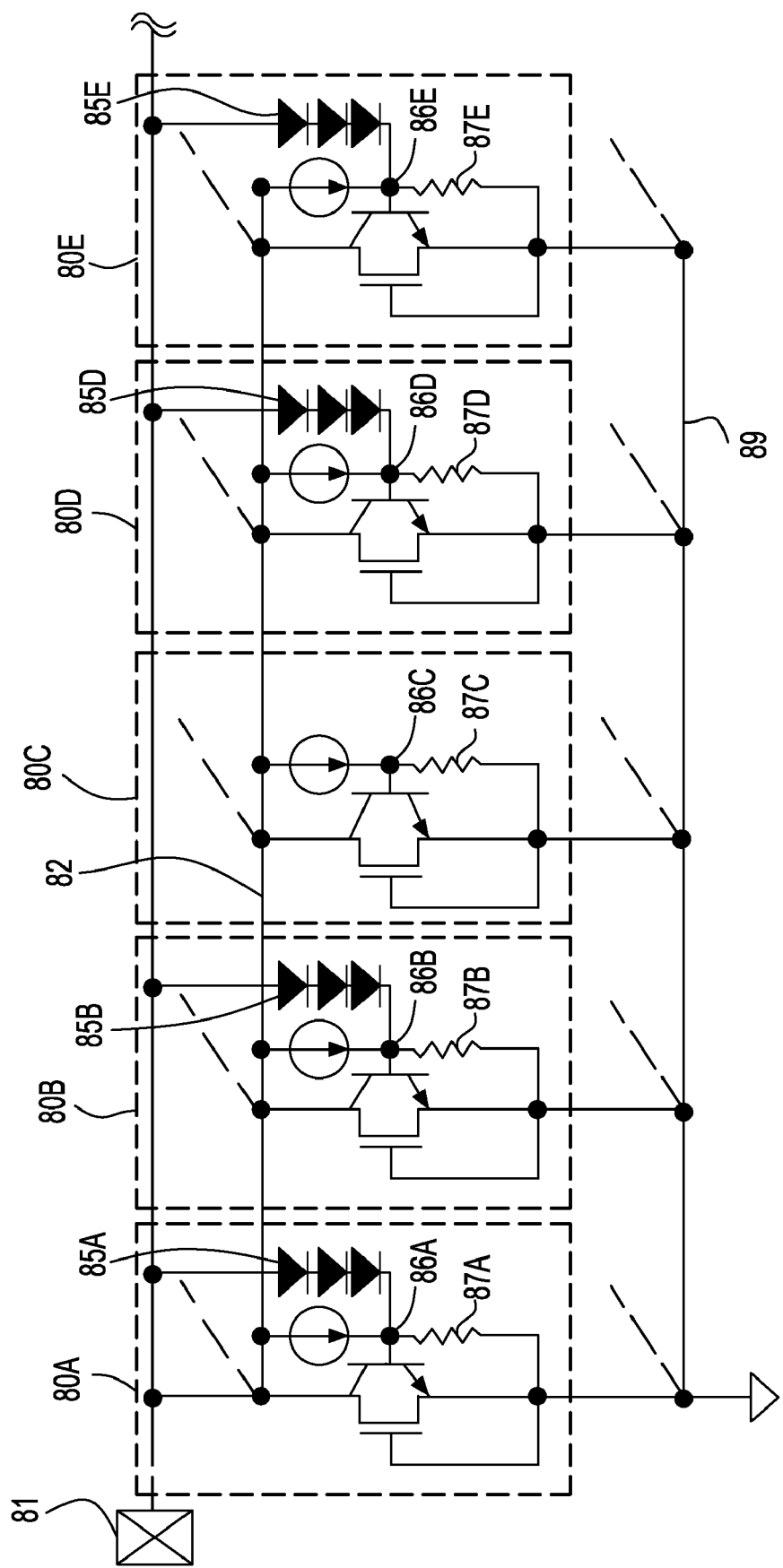
FIG. 8 shows circuit according to a first exemplary implementation of the present invention wherein the diodes connected to a power supply are used as external current injection sources.

FIG. 8 shows a first exemplary implementation of external current injection sources, each of which consists of a stack of three diodes (85A-85E). The parasitic resistors (87A-87E) between the body (86A-86E) of each finger (80A-80E), a positive power supply bus 82, the substrate ring contact 89, and the I/O pad 81 are also shown in FIG. 8. While only the middle finger 80C does not have an external current injection source in FIG. 8, the present invention allows an implementation wherein more than one finger is without an external current injection source or an implementation wherein each finger has an external current injection source as explained in accompanying paragraphs for FIG. 4.

Also, similar configuration is possible for general multi-finger NMOSFETs, for general multi-finger PMOSFETs, and for general multi-finger thyristors. The parameters of the diode stack may be changed to induce the same trigger voltage across the different fingers (80A-80E). Preferably, the widths of the stacks of diodes (85A-85E) is be adjusted to allow different amount of leakage current into the body (86A-86E) of the fingers (80A-80E) so that the voltage at the body (86A-86E) of each finger (80A-80E) are substantially identical across the fingers and all the fingers have the same trigger voltages. In this case, the stack of diodes is a tunable component that modulates the amount of injection current. The stack of diodes may contain only one diode or a series connection of at least two diodes.

Figure 9:
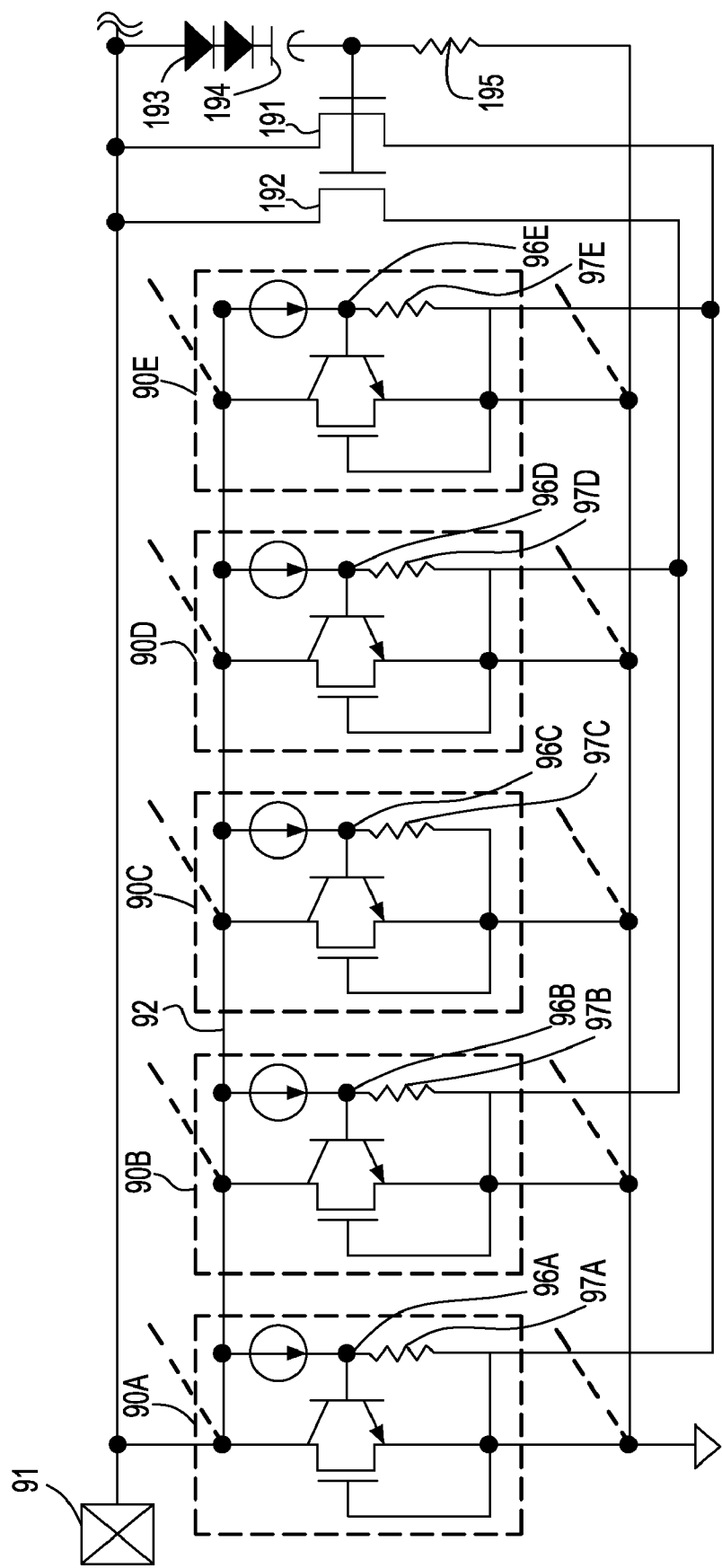
FIG. 9 shows a circuit according to a second exemplary implementation of the present invention wherein an RC triggered MOSFET circuit is used as external current injection sources.

FIG. 9 shows a second exemplary implementation of external current injection sources, which comprises an RC-triggered NMOSFET circuit connected to the bodies (96A-96E) of some of the fingers (90A-90E). The RC triggered NMOSFET circuit comprises two NMOSFETs (191 and 192), wherein each of the drains of the NMOSFETs (191 and 192) is connected to a positive power supply and each of the sources of the two NMOSFETs (191 and 192) are connected to a body (96A-96E) of one of the multiple fingers (90A-90E); and a series connection of a resistor 195 and a capacitor 194 between the positive power supply and ground, wherein the node in the series connection between the resistor 195 and the capacitor 194 is connected to the gates of the two MOSFETs (191 and 192). Two diodes 193 are located between the positive power supply bus 92 and the capacitor 194 in the RC-triggered NMOSFET circuit. The multiple fingers (90A-90E) are connected in a parallel connection such that the drains of the multiple fingers (90A-90E) are connected to a positive power supply bus 92 and the sources of the multiple fingers (90A-90E) are connected to a substrate ring contact 99. Parasitic resistors (96A-96E) of non-equal resistance value are connected between the body (96A-96E) and the source of each finger.

According to this exemplary implementation of the present invention, the two NMOSFETs (191 and 192) may be used as tunable components that modulate the amount of injection current into the fingers (96A-96E). The size and the number of diodes 193, as well as the resistance of the resistor 195 and the capacitance of the capacitor 194 may also be used as tunable components. While only the middle finger 90C does not have an external current injection source in FIG. 9, the present invention allows an implementation wherein more than one finger is without an external current injection source or an implementation wherein each finger has an external current injection source as explained in accompanying paragraphs for FIG. 4. Also, similar configuration is possible for general multi-finger NMOSFETs, for general multi-finger PMOSFETs, and for general multi-finger thyristors. The parameters of the diode stack may be changed to induce the same trigger voltage across the different fingers (90A-90E).

According to the present invention, the trigger voltages of multiple fingers of a multi-finger semiconductor device can be matched so that multiple fingers, and preferably all of the fingers have substantially matched trigger voltages and thus, turn on at the same time.

First, a semiconductor circuit with a multi-finger semiconductor device is provided. The semiconductor device may be a multifinger NMOSFET ESD protection circuit, a general purpose NMOSFET, a general purpose PMOSFET, or a general purpose thyristors. A thyristor may be, but is not limited to a Silicon Controlled Rectifier (SCR), an asymmetrical SCR (ASCR), a reverse conducting thyristor (RCT), a light activated SCR (LASCR; a light triggered thyristor (LTT)), a TRIAC (a bidirectional switching device containing two thyristor structures), a gate turn-off thyristor (GTO), an MCT (MOSFET controlled thyristor containing two additional FET structures for on/off control), a Base Resistance Controlled Thyristor (BRT), a Static Induction Thyristor (SITh), or a Field Controlled Thyristor (FCTh).

Second, at least one external current injection source connected to a component of one of the multiple fingers is designed. Only some of the multiple fingers may be provided with external current injection sources or all of the multiple fingers may be provided with external current injection sources. If the multi-finger semiconductor device is a multi-finger MOSFET, whether a multi-finger NMOSFET or a multi-finger PMOSFET, the component of the multiple fingers to which an external injection current source may be attached is the body of a finger of the MOSFET. If the multi-finger semiconductor device is a thyristor, the component of the multiple fingers to which an external injection current source may be attached is the gate of a finger of the thyristor.

The external injection current source may comprise of a diode, a stack of diodes, a bipolar transistor, a MOSFET, or any combination of these and may contain resistive components. Preferably, the external current injection circuit contains at least one substantially non-resistive electronic component. Most preferably, the external current injection source does not contain a resistor (a resistive electronic component) in the path of the current from the power supply to the body of a finger of the multi-finger device. For example, the stacks of diodes as shown in FIG. 8 or the RC-triggered NMOSFET circuit shown in FIG. 9 may also be used. The external current injection source may be at least one stack of diodes that comprises one diode or a series connection of at least two diodes. The external current injection source may alternatively comprise at least one RC-triggered NMOSFET, wherein the drain of the at least one NMOSFET is connected to a power supply and the source of the at least one RC-triggered NMOSFET is connected to at least one of the component of one of the multiple fingers and at least one series connection of a resistor and a capacitor between the positive power supply and ground, wherein a node in the series connection is connected to the gate of the at least one RC-triggered MOSFET. The external current injection sources are designed such that there is at least one parameter that can modulate the injection current on at lease some of the fingers. For example, the parameters may be the number of the width of a diode, the doping level of a portion of a substrate or a well, the size of shallow trench isolation around the fingers, the numbers of diodes, the capacitance, inductance, and/or resistance of circuit components.

Third, the voltage at the body of the each of the multiple fingers is simulated. The optimal simulation conditions are those that produce body voltages in the fingers of a multi-finger MOSFET close to the turn-on substrate potential or those that produce gate voltages in the fingers of a multi-finger thyristors close to the turn-on substrate potential.

Fourth, the at least one external current injection source is adjusted to match the trigger voltage of one of the multiple fingers with the trigger voltage of another of the multiple fingers until all the trigger voltages match. Since the external current injection sources have at least one parameter that can modulate the injection current on at lease some of the fingers, the at least one parameter, and preferably many parameters, of the external current injection sources are utilized in this step.

According to the present invention, the trigger voltages of multiple fingers of a multi-finger semiconductor device can be tuned so that multiple fingers, and preferably all of the fingers have trigger voltages that are substantially tuned to the target trigger voltage. The method of tuning the trigger voltages to a target trigger voltage is similar to the method of matching trigger voltages across the multiple fingers with the following modifications.

The target trigger voltage is defined during the design or prior to the design of external current injection sources. The adjustment of the at least one external current injection source is performed to match the trigger voltage of each of the multiple fingers to the target trigger voltage. The same adjustment methods as was used for matching the trigger voltages among multiple fingers of a multi-finger semiconductor device may be used to match the trigger voltages of the multiple fingers to a target trigger voltage.

Figure 10:
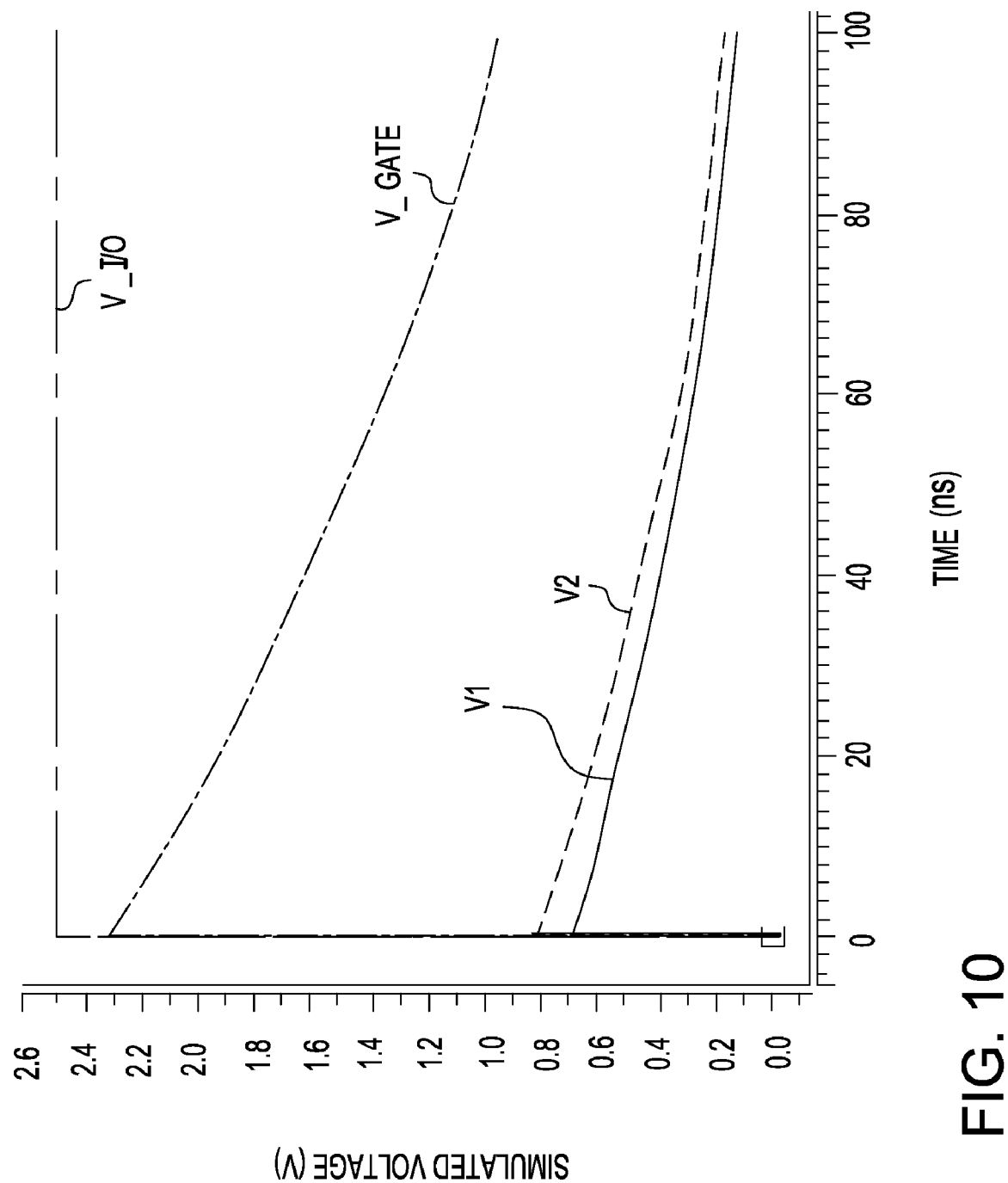
FIG. 10 shows a result of a simulation of an RC triggered multi-finger NMOSFET ESD protection circuit wherein the trigger voltages are not matched.
Figure 11:
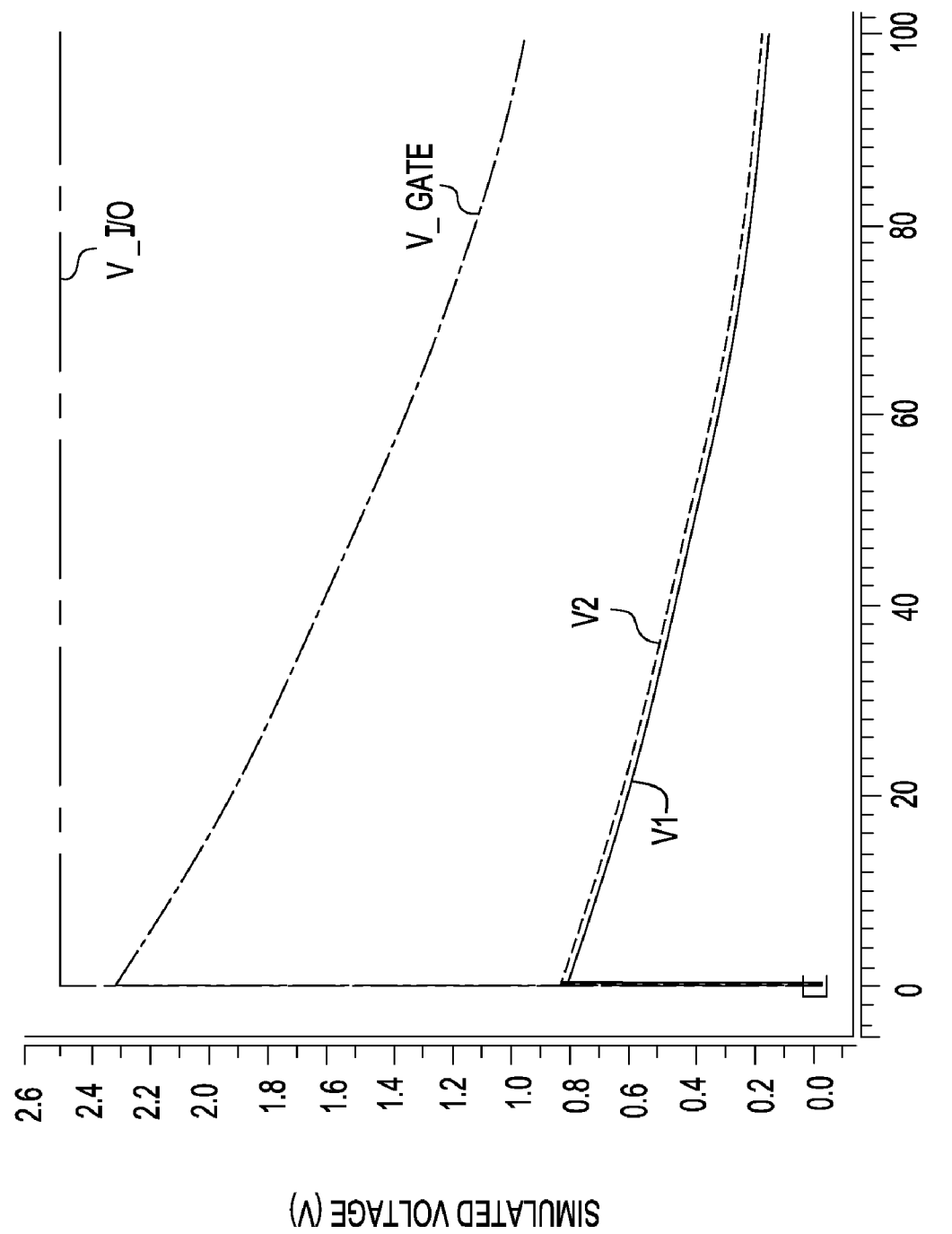
FIG. 11 shows a result of a simulation of an RC triggered multi-finger NMOSFET ESD protection circuit wherein the trigger voltages are matched.

FIG. 10 shows a simulation result for a circuit shown in FIG. 9 after an intermediate stage of matching trigger points among the multiple fingers of the multi-finger NMOSFET. In the simulation shown in FIG. 10, the transient response of the gate voltage V_gate at the two NMOSFETs (191 and 192), the transient response of the substrate potential V1 at the body 96A of the leftmost finger 90A and at the body 96E of the rightmost finger 90E, and the transient response of the substrate potential V2 at the body 96B of the second finger 90B and at the body 96D of the fourth finger 90D are shown for the setting of 1 micron for the width of both of the two NMOSFETs (191 and 192). While this produced a better result than a circuit without any external current injection sources, a further adjustment using the width of the NMOSFET 191 that is connected to the leftmost finger 90A and to the rightmost finger 90E can improve the matching between the two voltages, V1 and V2. Another simulation results with the width of the NMOSFET 191 connected to the outermost fingers (90A and 90E) set at 5.5 microns are shown FIG. 11, which shows an improved matching between the four fingers. Since each finger of the multi-finger NMOSFET ESD protection circuit is turned on when the substrate potential at the finger exceeds 0.7V and essentially turns off below 0.7V, according to the simulation shown in FIG. 10, the two outermost fingers turn on for a shorter duration than the second and fourth fingers, or worse, not even turn on as discussed above. According to the simulation shown in FIG. 11, the four fingers turn on and turn off substantially at the same time. An extension of this type of adjustment can match the trigger voltages across the five fingers shown in FIGS. 4, 8, and 9, and in general, to any multi-finger semiconductor device described herein with an arbitrary number of fingers.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor circuit comprising:
    a semiconductor device with multiple fingers wherein said multiple fingers are connected in a parallel connection; and
    at least one external current injection source connected to a component of said multiple fingers, wherein no external current injection source is attached to at least one of said multiple fingers.

2. The semiconductor circuit of claim 1, wherein said semiconductor device is a metal oxide semiconductor field effect transistor (MOSFET) and said component is the body of said semiconductor device.

3. The semiconductor circuit of claim 1, wherein said semiconductor device is a semiconductor thyristor and said component is the gate of said semiconductor thyristor.

4. The semiconductor circuit of claim 1, wherein a first end of said parallel connection is connected to a first power supply and a second end of said parallel connection is connected to a second power supply.

5. The semiconductor circuit of claim 4, further comprising a parasitic resistor between said component of each of said multiple fingers and a substrate ring contact.

6. The semiconductor circuit of claim 5, wherein said at least one external current injection source is directly connected to the power supply to which drains or anodes of said multiple fingers are directly connected.

7. The semiconductor circuit of claim 6, wherein the set of resistance values for the collection of said parasitic resistors has at least one non-equal value within said set.

8. The semiconductor circuit of claim 7, wherein at least three of said multiple fingers have substantially matched trigger voltages.

9. The semiconductor circuit of claim 8, wherein all of said multiple fingers have substantially matched trigger voltages.

10. The semiconductor circuit of claim 9, wherein at least one of said external current injection source has a tunable component that modulates the amount of injection current.

11. The semiconductor circuit of claim 7, wherein at least one external current injection source injects a different amount of injection current than another external current injection source.

12. The semiconductor circuit of claim 1, wherein at least three of said multiple fingers have substantially matched trigger voltages.

13. The semiconductor circuit of claim 1, wherein all of said multiple fingers have substantially matched trigger voltages.

14. The semiconductor circuit of claim 13, wherein said semiconductor device is a metal oxide semiconductor field effect transistor (MOSFET) and said component is the body of said semiconductor device.

15. The semiconductor circuit of claim 13, wherein said semiconductor device is a semiconductor thyristor and said component is the gate of said semiconductor thyristor.

16. The semiconductor circuit of claim 13, wherein at least one of said external current injection source has a tunable component that modulates the amount of injection current.

17. A semiconductor circuit comprising:
a semiconductor device with multiple fingers wherein said multiple fingers are connected in a parallel connection; and
at least one stack of diodes that is connected to the body of one of said multiple fingers, wherein said at least one stack of diodes comprises one diode or a series connection of at least two diodes, and wherein all of said multiple fingers have substantially matched trigger voltages, wherein no external current injection source is attached to at least one of said multiple fingers.

18. The semiconductor circuit of claim 17, further comprising at least two stacks of diodes and at least one of said stacks of diodes is not equal to another of said stacks of diodes.

19. The semiconductor circuit of claim 17, wherein at least one external current injection source injects a different amount of injection current than another external current injection source.

20. A semiconductor circuit comprising:
a semiconductor device with multiple fingers wherein said multiple fingers are connected in a parallel connection;
at least two MOSFETs, wherein the drain of a first MOSFET among said at least two MOSFETs is connected to a power supply and the source of said first MOSFET is connected to a component of one of said multiple fingers, and the drain of a second MOSFET among said at least two MOSFETs is connected to said power supply and the source of said second MOSFET is connected to a component of another of said multiple fingers; and
at least one series connection of a resistor and a capacitor between said power supply and ground, wherein a node in said series connection is connected to the gate of said at least one MOSFET.

21. The semiconductor circuit of claim 20, wherein all of said multiple fingers have substantially matched trigger voltages.

22. The method of claim 20, wherein no external current injection source is attached to at least one of said multiple fingers.

23. A method of matching trigger voltages of multiple fingers of a multi-finger semiconductor device comprising:
providing a semiconductor circuit including a semiconductor device and at least one external current injection source, wherein said semiconductor device includes multiple fingers that are connected in a parallel connection, and said at least one external current injection source is connected to a component of said multiple fingers, wherein no external current injection source is attached to at least one of said multiple fingers;
providing at least one external current injection source connected to a component of one of said multiple fingers;
simulating a voltage at the body of each of said multiple fingers; and
adjusting said at least one external current injection source to match the trigger voltage of one of said multiple fingers with the trigger voltage of another of said multiple fingers until all of said trigger voltages match.

24. The method of claim 23, further comprising designing at least one stack of diodes that is connected to said component of one of said multiple fingers, wherein said at least one stack of diodes comprises one diode or a series connection of at least two diodes.

25. The method of claim 23, further comprising:
designing at least one RC-triggered MOSFET, wherein the drain of said at least one RC-triggered MOSFET is connected to a power supply and the source of said at least one RC-triggered MOSFET is connected to at least one of said component of one of said multiple fingers; and
designing at least one series connection of a resistor and a capacitor between said power supply and ground, wherein a node in said series connection is connected to the gate of said at least one RC-triggered MOSFET.

26. The method of claim 23, wherein said semiconductor device is a metal oxide semiconductor field effect transistor (MOSFET) and said component is the body of said semiconductor device.

27. The method of claim 23, wherein said semiconductor device is a semiconductor thyristor and said component is the gate of said semiconductor thyristor.

28. A method of tuning trigger voltages of multiple fingers of a multi-finger semiconductor device comprising:
providing a semiconductor circuit including a semiconductor device and at least one external current injection source, wherein said semiconductor device includes multiple fingers that are connected in a parallel connection, and said at least one external current injection source is connected to a component of said multiple fingers, wherein no external current injection source is attached to at least one of said multiple fingers;

providing at least one external current injection source connected to the body of one of said multiple fingers;

defining a target trigger voltage;

simulating a voltage at the body of each of said multiple fingers; and adjusting said at least one external current injection source to match the trigger voltage of each of said multiple fingers with said target trigger voltage.

29. The method of claim 28, further comprising designing at least one stack of diodes that is connected to said component of one of said multiple fingers, wherein said at least one stack of diodes comprises one diode or a series connection of at least two diodes.

30. The method of claim 28, further comprising:

designing at least one RC-triggered MOSFET, wherein the drain of said at least one RC-triggered MOSFET is connected to a power supply and the source of said at least one RC-triggered MOSFET is connected to at least one of said component of one of said multiple fingers; and designing at least one series connection of a resistor and a capacitor between said power supply and ground, wherein a node in said series connection is connected to the gate of said at least one RC-triggered MOSFET.

31. The method of claim 28, wherein said semiconductor device is a metal oxide semiconductor field effect transistor (MOSFET) and said component is the body of said semiconductor device.

32. The method of claim 28, wherein said semiconductor device is a semiconductor thyristor and said component is the gate of said semiconductor thyristor.

* * * * *